(12) United States Patent
Endo et al.

(10) Patent No.: US 6,310,572 B1
(45) Date of Patent: Oct. 30, 2001

(54) SEMICONDUCTOR INTEGRATED CIRCUIT HAVING PLURAL INPUT CONTROL CIRCUITS

(75) Inventors: Toshiaki Endo; Sanroku Tsukamoto, both of Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/419,067

(22) Filed: Oct. 15, 1999

(30) Foreign Application Priority Data

Jan. 26, 1999 (JP) .................................................. 11-016864

(51) Int. Cl.⁷ ..................................................... H03M 1/12
(52) U.S. Cl. .......................... 341/156; 341/122; 341/155; 341/158
(58) Field of Search ..................................... 341/156, 159, 341/155, 158, 122, 160, 100, 116, 118, 120, 126, 143

(56) References Cited

U.S. PATENT DOCUMENTS

| | | | |
|---|---|---|---|
| 4,912,470 | * 3/1990 | Hosatani et al. | 341/159 |
| 5,075,688 | * 12/1991 | Hosotani et al. | 341/122 |
| 5,247,301 | * 9/1993 | Yahagi et al. | 341/156 |
| 5,798,725 | * 8/1998 | Okada | 341/158 |
| 5,874,911 | * 2/1999 | Kodama | 341/156 |

FOREIGN PATENT DOCUMENTS 4-129424    4/1992    (JP) .

OTHER PUBLICATIONS

"A CMOS 9–Bit 25 MHx 100mW ADC", Kasahara et al, *Denshi Jouhou Tsuushin Gakkai ICD91–87*, pp. 43–47.

* cited by examiner

*Primary Examiner*—Brian Young
*Assistant Examiner*—John Nguyen
(74) *Attorney, Agent, or Firm*—Arent Fox Kintner Plotkin & Kahn PLLC

(57) ABSTRACT

A series to parallel A/D type converter converts an analog input signal to a digital output signal. The A/D converter has an upper rank comparator which performs A/D conversion of upper order bits and a lower rank comparator which performs A/D conversion of lower order bits. An input control circuit receives the analog input signal and generates a first input signal which is provided to the upper rank comparator and generates a second input signal which is provided to the lower rank comparator. Both the upper and lower rank comparators receive the respective first and second input signal from the input control circuit and compare the respective input signals with predetermined reference voltages to generate a digital output signal. The input control circuit includes first and second switches which each have a first terminal connected to a common node for receiving the analog input signal and a second terminal connected to the respective upper and lower rank comparators to provide the first and second input signals to the comparators. A third switch, which functions as an interchannel control circuit, connects the second terminals of the first and second switches.

28 Claims, 10 Drawing Sheets

SEMICONDUCTOR INTEGRATED CIRCUIT HAVING PLURAL INPUT CONTROL CIRCUITS

BACKGROUND OF THE INVENTION

The present invention relates to semiconductor integrated circuits, and more particularly, to semiconductor integrated circuits that include series-parallel type analog-to-digital converters having analog signal processing circuits.

A series-parallel type analog-to-digital (A/D) converter includes an upper rank comparator, which performs A/D conversion of upper rank bits, and a lower rank comparator, which performs A/D conversion of lower rank bits. The upper rank comparator samples analog input signals and compares the sampled signals with an upper rank reference voltage signal. The lower rank comparator samples analog input signals and compares the sampled signals with a lower rank reference voltage signal, which is based on the comparison result of the upper rank comparator. The A/D converter combines the comparison results of the upper and lower rank comparators to generate a digital signal. Thus, the sampling level of the upper rank comparator and that of the lower rank comparator must be substantially the same. The upper and lower rank comparators must perform sampling at precisely the same timing to obtain sampling levels that are substantially the same. However, differences in the load conditions of sample and hold (S/H) control signals, differences in the lengths of wires, and other factors cause unsynchronized sampling. This results in the upper and lower rank comparators sampling different analog input signals and affects the linearity of signals when combining the output signals of the upper rank and lower rank comparators.

FIG. 1 is a schematic circuit diagram showing a prior art series-parallel type comparator 10. The A/D converter 10 includes an upper rank comparator 11 and a lower rank comparator 12. The upper rank comparator 11 includes voltage comparators $CM_{U1}$–$CM_{Um}$, the number m of which corresponds to the number of upper rank bits in the digital signal. The lower rank comparator 12 includes voltage comparators $CM_{L1}$–$CM_{Ln}$, the number n of which corresponds to the number of lower rank bits. The voltage comparators $CM_{U1}$–$CM_{Um}$, $CM_{L1}$–$CM_{Ln}$ are chopper type voltage comparators. Each voltage comparator $CM_{U1}$–$CM_{Um}$, $CM_{L1}$–$CM_{Ln}$ samples an analog input signal $V_{in}$ and compares the sampled level with reference voltages $V_{U1}$–$V_{Um}$, $V_{L1}$–$V_{Ln}$, respectively.

FIG. 3 is a schematic circuit diagram showing the voltage comparator $CM_{U1}$. Since each voltage comparator $CM_{U1}$–$CM_{Um}$, $CM_{L1}$–$CM_{Ln}$ has the same structure, only the voltage comparator $CM_{U1}$ will be described in detail.

The voltage comparator $CM_{U1}$ includes switches SW1–SW3, a capacitor C1, an inverter 13, and a flip-flop (FF) 14. The input terminals which receive the analog input signal $V_{in}$ and the reference voltage $V_{U1}$ are connected to a first input terminal (node N1) of the capacitor C1 via the switches SW1, SW2, respectively. The switches SW1, SW2 are opened and closed in accordance with control signals S1u, S2u, respectively. The control signals S1u, S2u are output from a control signal generator (not shown). The respective switches SW1, SW2 are closed when the control signals S1u, S2u are high (H-level).

The capacitor C1 has a second terminal (node N2), which is connected to the data input terminal of the FF 14 via the inverter 13. The switch SW3 is opened and closed in accordance with the control signal S1u. The switch SW3 closes when the control signal S1u is high. The FF 14 latches the input signal in response to the control signal S2u and outputs a latch signal Out.

FIG. 4 is a timing chart showing the operation of the voltage comparator $CM_{U1}$. If the control signal S1u is at the H-level, or is "high", while the control signal S2u is at the L-level, the switches SW1, SW3 are ON and the switch SW2 is OFF. In this state, the inverter 13 is biased at a threshold voltage Vt and electric charge ($C0 \times (V_{in}-Vt)$) is stored in the capacitor C1. C0 represents the capacitance value of the capacitor C1 and $V_{in}$ represents the voltage of the analog input signal. This operation is referred to as auto zero, during which the analog input signal $V_{in}$ is stored in the capacitor C1 when the voltage comparator $CM_{U1}$ is biased at the threshold voltage.

When the control signal S1u shifts to the L-level and the control signal S2u shifts to the H-level, the switches SW1, SW3 are opened and the switch SW2 is closed. In this state, the node N2 enters an electrically floating state. Thus, according to the charge conservation law, the charge stored in the capacitor C1 does not change. The application of the upper rank reference voltage $V_{U1}$, instead of the analog input signal $V_{in}$ to the node N1, or the capacitor C1, sets a potential V2 at the node N2 at $Vt+V_{U1}-V_{in}$ since charge is conserved in the capacitor C1. In other words, the potential V2 changes from the threshold voltage Vt by ($V_{U1}-V_{in}$). The voltage V2 is reverse-amplified by the inverter 13 and a potential having a level which logic value can sufficiently be distinguished by the FF 14 is generated. The FF14 is strobed when the potential at the node N3 is stabilized (final point during comparison) to generate a logic signal Out.

Accordingly, the A/D converter 10 operates as shown in FIG. 2. If the control signals S1u, S1v are at the H-level, while the control signals S2u, S2v are at the L-level, the voltage comparators $CM_{U1}$–$CM_{Um}$, $CM_{L1}$–$CM_{Ln}$ of the upper and lower rank comparators 11, 12 each performs the auto zero operation, while receiving the analog input signal $V_{in}$. Afterward, when the control signals S1u, S2u shift to the L-level, each voltage comparator $CM_{U1}$–$CM_{Um}$, $CM_{L1}$–$CM_{Ln}$ stores the voltage of the analog input signal $V_{in}$ just before the control signals S1u, S2u shift from the H-level to the L-level.

In response to an H-level control signal S2u, the upper rank comparator 11 compares the analog input signal $V_{in}$ with the upper rank reference voltages $V_{U1}$–$V_{Um}$ and A/D converts the upper rank bits, while designating the lower rank reference voltages $V_{L1}$–$V_{Ln}$ of the lower rank comparator 12 based on the comparison results.

After performing the auto zero operation simultaneously with the upper rank comparator 11, the lower rank comparator 12 shifts all of the switches SW1–SW3 to OFF (i.e., open) and stores the analog input signal $V_{in}$ while waiting until the upper rank comparator 11 determines the lower rank reference voltages $V_{L1}$–$V_{Ln}$ (i.e., until the upper rank bits are determined). The lower rank comparator 12 then compares the analog input signal $V_{in}$ with the lower rank reference voltages $V_{L1}$–$V_{Ln}$ and A/D converts the lower bits. The A/D converter 10 combines the upper rank bits from the upper rank comparator 11 with the lower rank bits from the lower rank comparator 12 and generates an A/D converted signal.

The upper and lower rank comparators 11, 12 must simultaneously shift from a sampling state to a holding state in order to receive analog input signals having the same level during sampling. However, it is impossible to control every switch SW1 of the voltage comparators $CM_{U1}$–$CM_{Um}$, $CM_{L1}$–$CM_{Ln}$ at the same timing. With reference to FIG. 2, the sampling tolerance voltage between the upper and lower rank comparators 11, 12 is denoted as Ve. If S represents the changing rate of the analog input signal $V_{in}$ and te[ns] represents the sample and hold timing tolerance between the upper rank comparator 11 and the lower rank comparator 12, S×te represents the sampling tolerance voltage Ve. Accordingly, the timing tolerance te that is allowed decreases as the changing rate S increases. In other words, the sampling tolerance of the upper and lower rank comparators 11, 12 is narrowed.

The arrangement of a sample and hold (S/H) circuit upstream of the A/D converter 10 shifts the changing rate S of the analog input signal to a value close to zero and allows the sampling level of the upper and lower rank comparators 11, 12 to be substantially the same. However, an S/H circuit includes an amplifier and thus has a shortcoming in that the sampling voltage changes in accordance with the characteristic (speed) of the amplifier.

FIG. 5 is a schematic circuit diagram showing an A/D converter 20, which takes samples of the same level, without employing an A/D converter 10, which incorporates an amplifier (refer to Masumi Kasahara et al., "CMOS 9 Bit 25 MHz 100 mW A-D converter," *Denshi Jouhou Tsuushin Gakkai,* ICD91-87, pp. 43–47).

The A/D converter 20 has a switch SWt, which is connected between switches SW1 of the voltage comparators $CM_{U1}$–$CM_{Um}$, $CM_{L1}$–$CM_{Ln}$ and the analog input signal $V_{in}$. The upper and lower rank comparators 11, 12 receive an internal analog signal $V_{in0}$, which has the potential of the node N4 between the voltage comparators $CM_{U1}$–$CM_{Um}$, $CM_{L1}$–$CM_{Ln}$ and the switch SWt. A control signal St sent from a control signal generator (not shown) shifts the switch SWt between ON and OFF. This results in each voltage comparator $CM_{U1}$–$CM_{Um}$, $CM_{L1}$–$CM_{Ln}$ storing the same level of the internal analog signal $V_{in0}$.

More specifically, as shown in FIG. 6, if the control signals S1u, S1v are at the H-level, the upper and lower rank comparators 11, 12 perform the auto zero operation based on the internal analog signal $V_{in0}$. In this state, the potential of the internal analog signal $V_{in0}$ is substantially the same as the analog input signal $V_{in}$ since the switch SWt is ON. Accordingly, the voltage comparators $CM_{U1}$–$CM_{Um}$, $CM_{L1}$–$CM_{Ln}$ perform the auto zero operation based on the analog input signal $V_{in}$.

If the switch SWt is subsequently shifted to OFF, the internal analog signal $V_{in0}$ becomes constant. Accordingly, the voltage comparators $CM_{U1}$–$CM_{Um}$, $CM_{L1}$–$CM_{Ln}$ store the potential of the analog input signal $V_{in}$ just before the switch SWt shifts to OFF. That is, the voltage comparators $CM_{U1}$–$CM_{Um}$, $CM_{L1}$–$CM_{Ln}$ store a constant internal analog signal $V_{in0}$. Therefore, the upper and lower rank comparators 11, 12 store substantially the same potential even if the fall timing of each of the control signals S1u, S1v differs from one another.

As described above, the switch SWt is shifted to OFF before the upper and lower rank comparators 11, 12 shift from a sampling state to a holding state (i.e., the switches SW1 of the voltage comparators $CM_{U1}$–$CM_{Um}$, $CM_{L1}$–$CM_{Ln}$ being shifted to OFF). Accordingly, the changing rate S of the analog input signal $V_{in}$ is substantially zero.

However, the upper and lower rank comparators 11, 12 are connected to each other by the same wire. Thus, if the switch SWt is shifted to OFF, the node N4 is unaffected by the analog input signal $V_{in}$. That is, the node N4 enters a floating state. In the floating state, the lower rank comparator 12 (or the upper rank comparator 11) is affected by the noise produced during the switching (shifting between the sampling state and the holding state) of the upper rank comparator 11 (or the lower rank comparator 12). Furthermore, the wiring volume of a circuit having a switch is smaller than that of a circuit having no switches. Hence, the voltage fluctuation of the analog input signal $V_{in}$ increases when switching noise is produced in a circuit having a switch. This increases errors in the digital signal generated by the A/D converter 20 and increases the error rate.

To prevent an increase in the error rate, redundancy may be employed for the conversion operation of a lower rank comparator in order to digitally compensate for the sampling error based on the results of the comparison of the lower rank comparator (refer to N. Fukushima et al., "A CMOS 40 MHz 8b 105 mW two-step ADC", *ISSCC Dig, Tech. Papers,* February, 1989, pp. 14–15). The employment of redundancy allows for compensation within a certain sampling error range. However, if the level of the analog input signal is relatively large, the sampling error exceeds the range that can be compensated. This affects the linearity of the digital signals.

SUMMARY OF THE INVENTION

Accordingly, it is an objective of the present invention to provide a semiconductor integrated circuit that reduces the sampling errors of an analog input signal.

To achieve the above objective, the present invention provides a semiconductor integrated circuit including a plurality of analog processing circuits for processing analog signals, and a plurality of input control circuits connected to the plurality of analog processing circuits, respectively. The input control circuits receive an analog signal through a common node and selectively send the analog signal to the analog processing circuits.

In a further aspect of the present invention, a semiconductor integrated circuit includes a plurality of voltage comparators, each comparing an analog signal with a reference voltage and generating a signal indicating the comparison result, and a plurality of input control circuits connected to the voltage comparators, respectively. The input control circuits receive the analog signal through a common node and selectively send the analog signal to the voltage comparators. A reference voltage generator receives a comparison result signal from a first voltage comparator of the plurality of voltage comparators and generates the reference voltage based on the comparison result signal. A plurality of encoders receive the comparison results from the voltage comparators and generate code signals, respectively.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
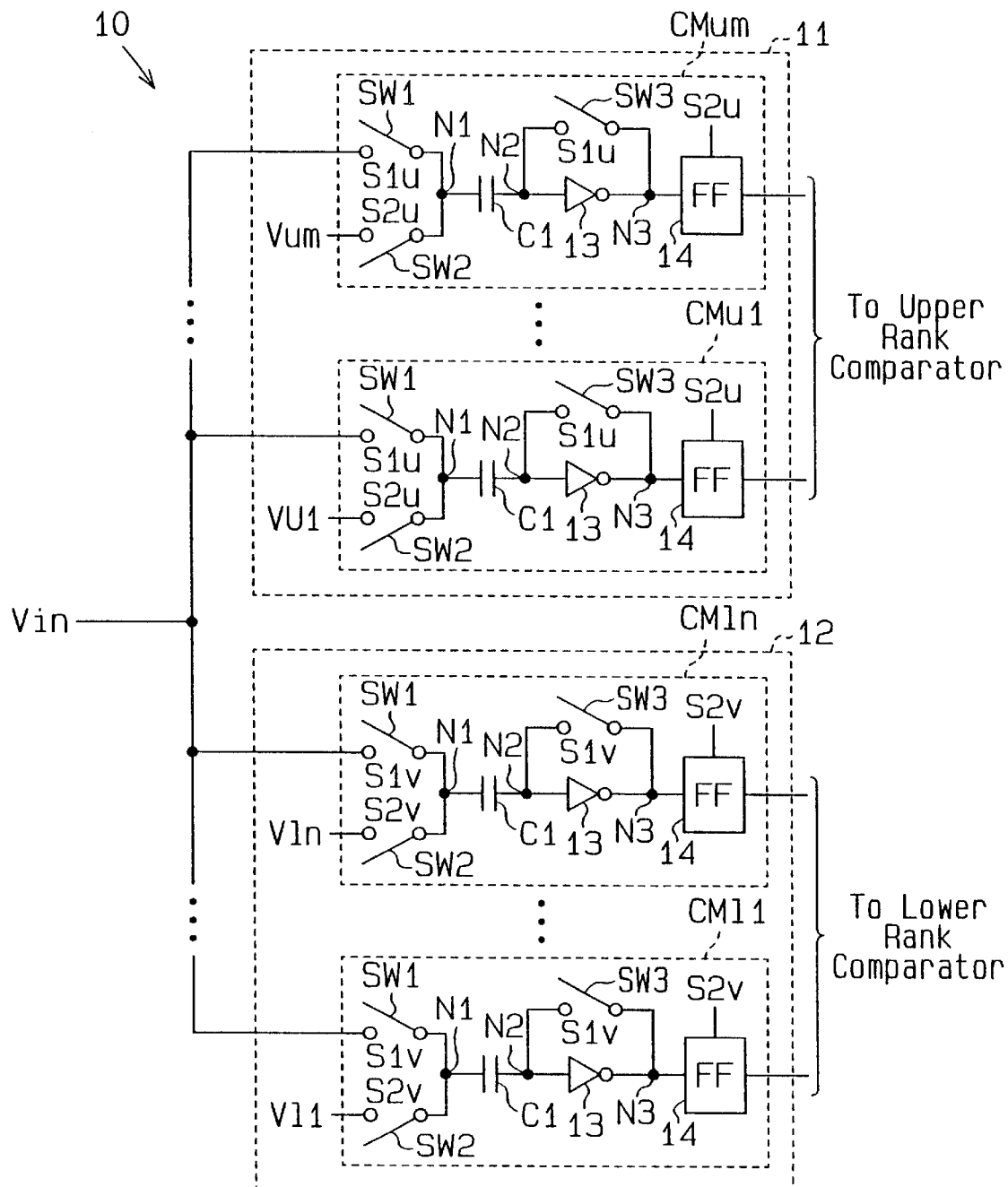
FIG. 1 is a circuit diagram showing a prior art series-parallel type A/D converter.
Figure 2:
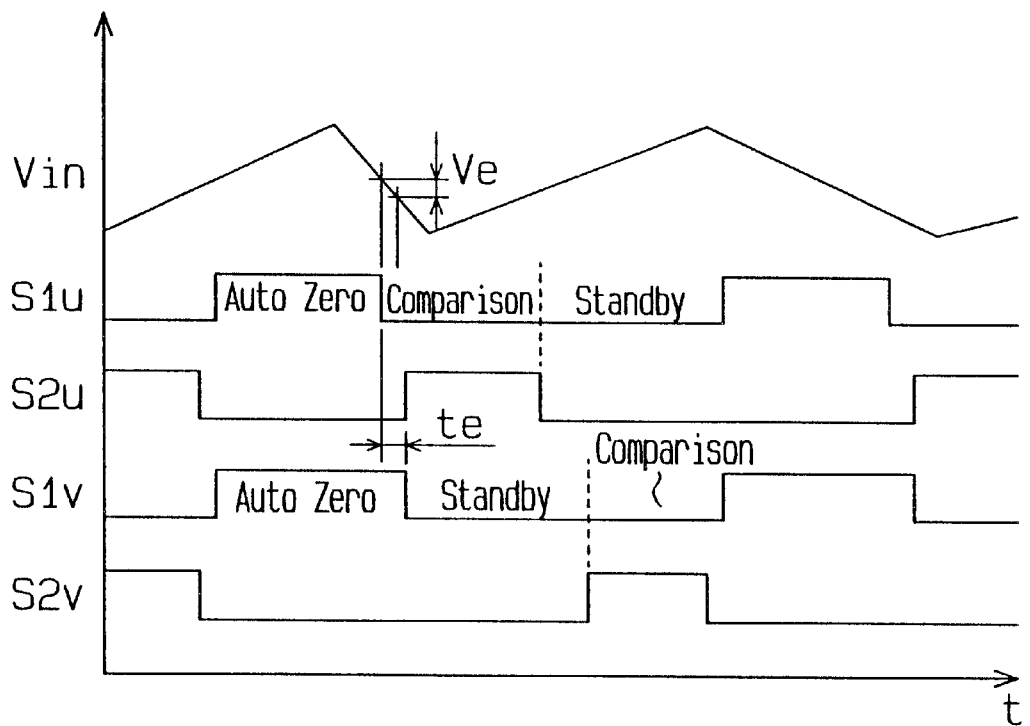
FIG. 2 is a timing chart showing the operation of the A/D converter of FIG. 1.
Figure 3:
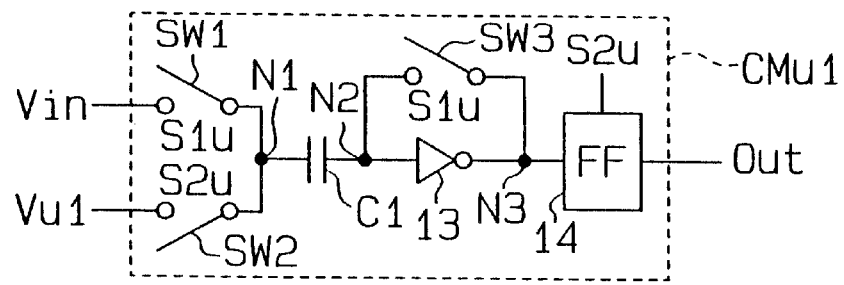
FIG. 3 is a circuit diagram showing a chopper type voltage comparator of the A/D converter of FIG. 1.
Figure 4:
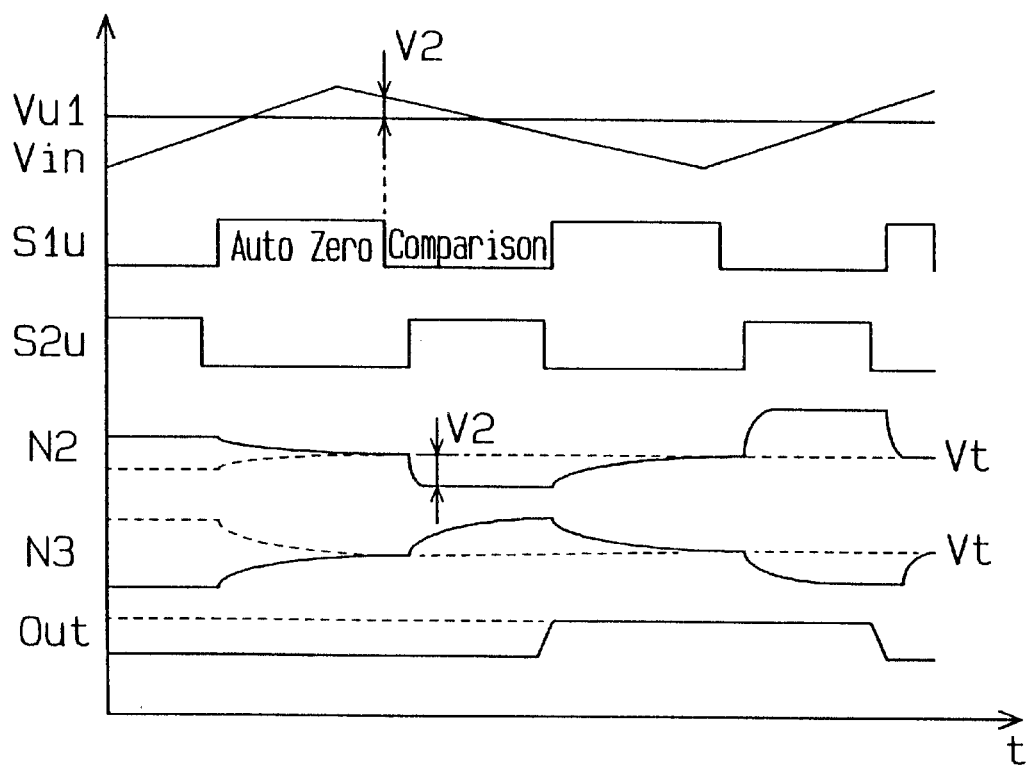
FIG. 4 is a timing chart showing the operation of the chopper type voltage comparator of FIG. 3.
Figure 5:
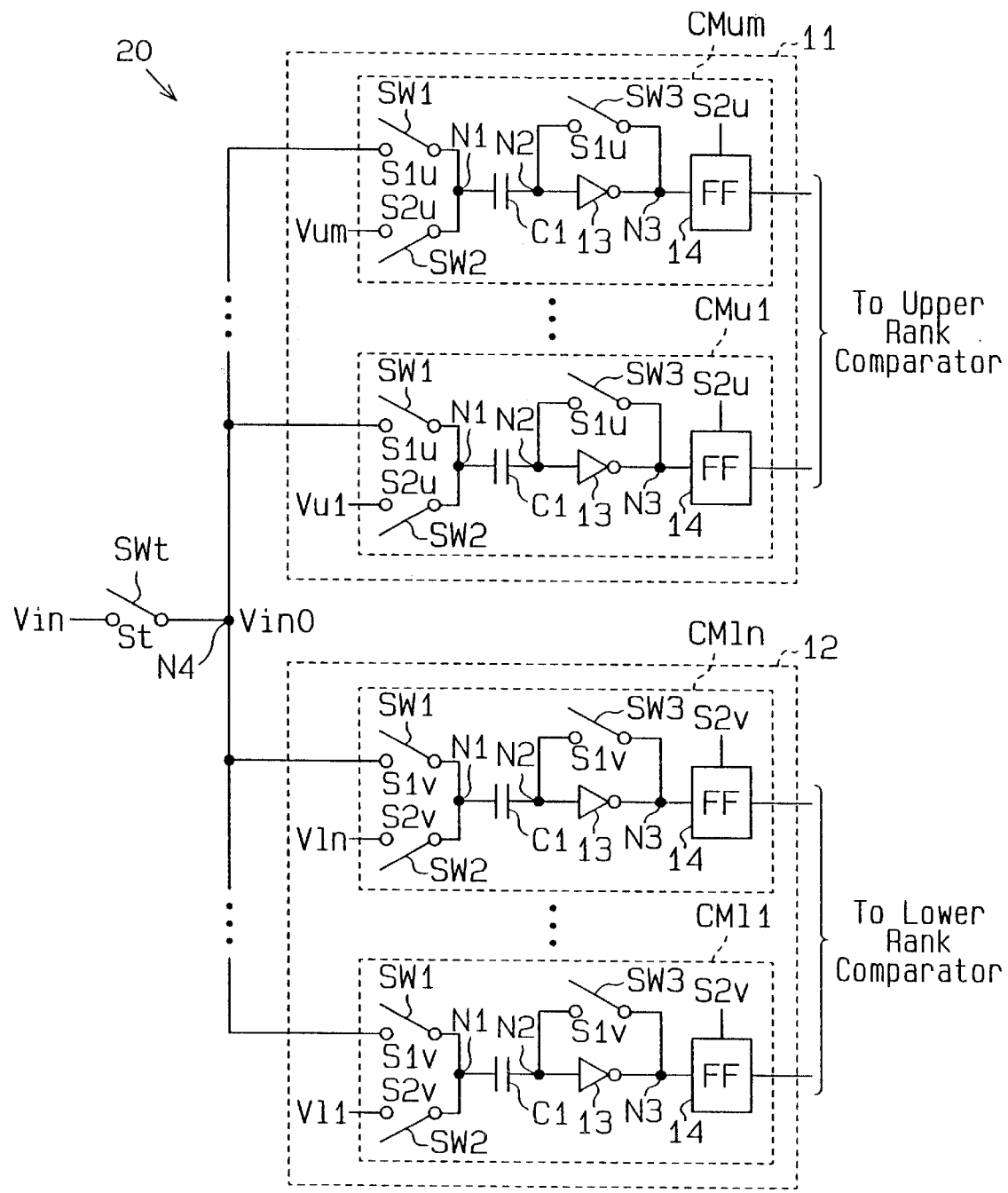
FIG. 5 is a circuit diagram showing a second prior art series-parallel type converter.
Figure 6:
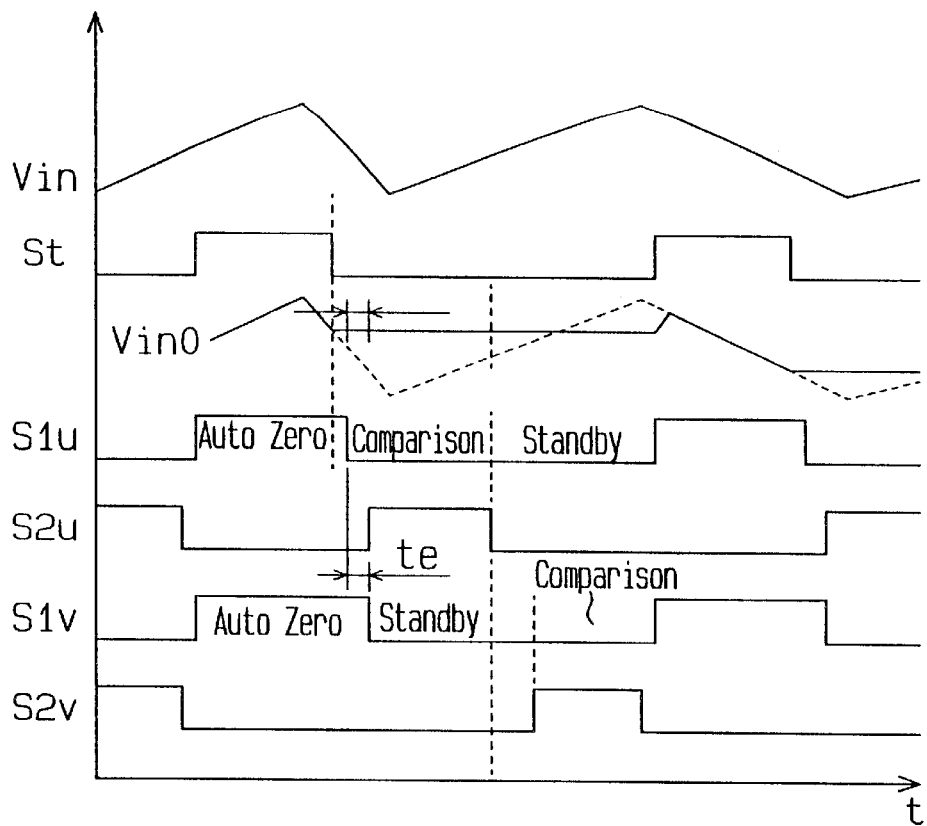
FIG. 6 is a timing chart showing the operation of the A/D converter of FIG. 5.

In the drawings, like numerals are used for like elements throughout.

[First Embodiment]

Figure 7:
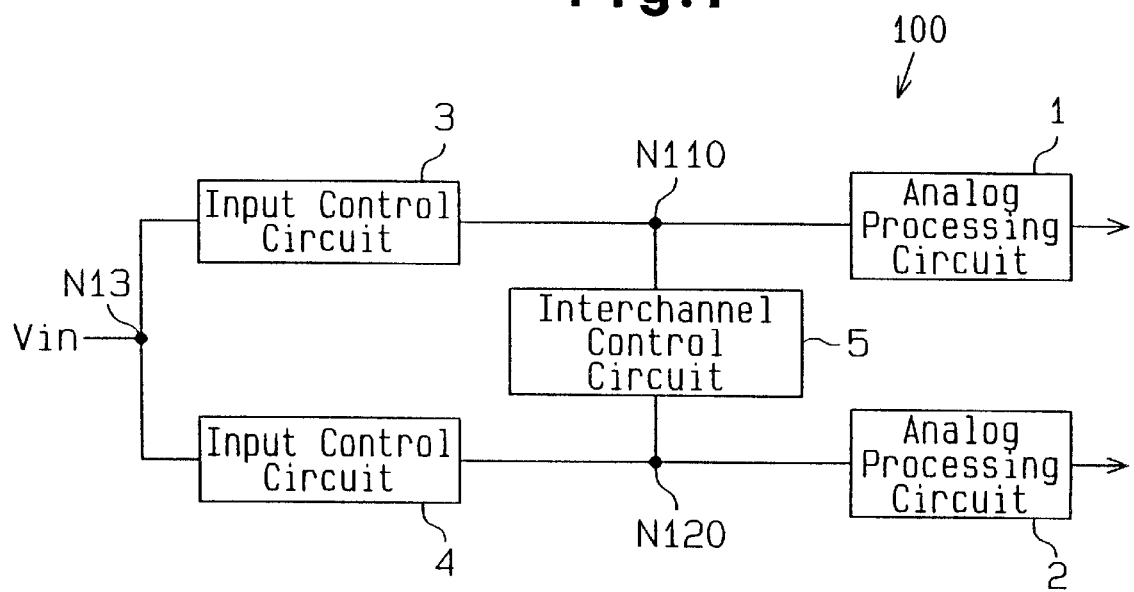
FIG. 7 is a schematic block diagram showing a semiconductor integrated circuit according to a first embodiment of the present invention.

FIG. 7 is a schematic block diagram showing a semiconductor integrated circuit 100 according to a first embodiment of the present invention. The semiconductor integrated circuit 100 includes a first analog processing circuit 1, a second analog processing circuit 2, a first input control circuit 3, a second input control circuit 4, and an interchannel control circuit 5 connected between a node N110, which is located between the first analog processing circuit 1 and the first input control circuit 3, and a node N120, which is located between the second analog processing circuit 2 and the second input control circuit 4. An analog input signal $V_{in}$ is received by the input control circuits 3, 4 through a common node N13. In the first embodiment, the wires connected to the analog processing circuits 1, 2 are independent from each other. This reduces interference between the analog processing circuits 1, 2 when switching noise is produced in the analog processing circuits 1, 2. The interchannel control circuit 5 has a high resistance value to reduce noise interference between the wires.

[Second Embodiment]

Figure 8:
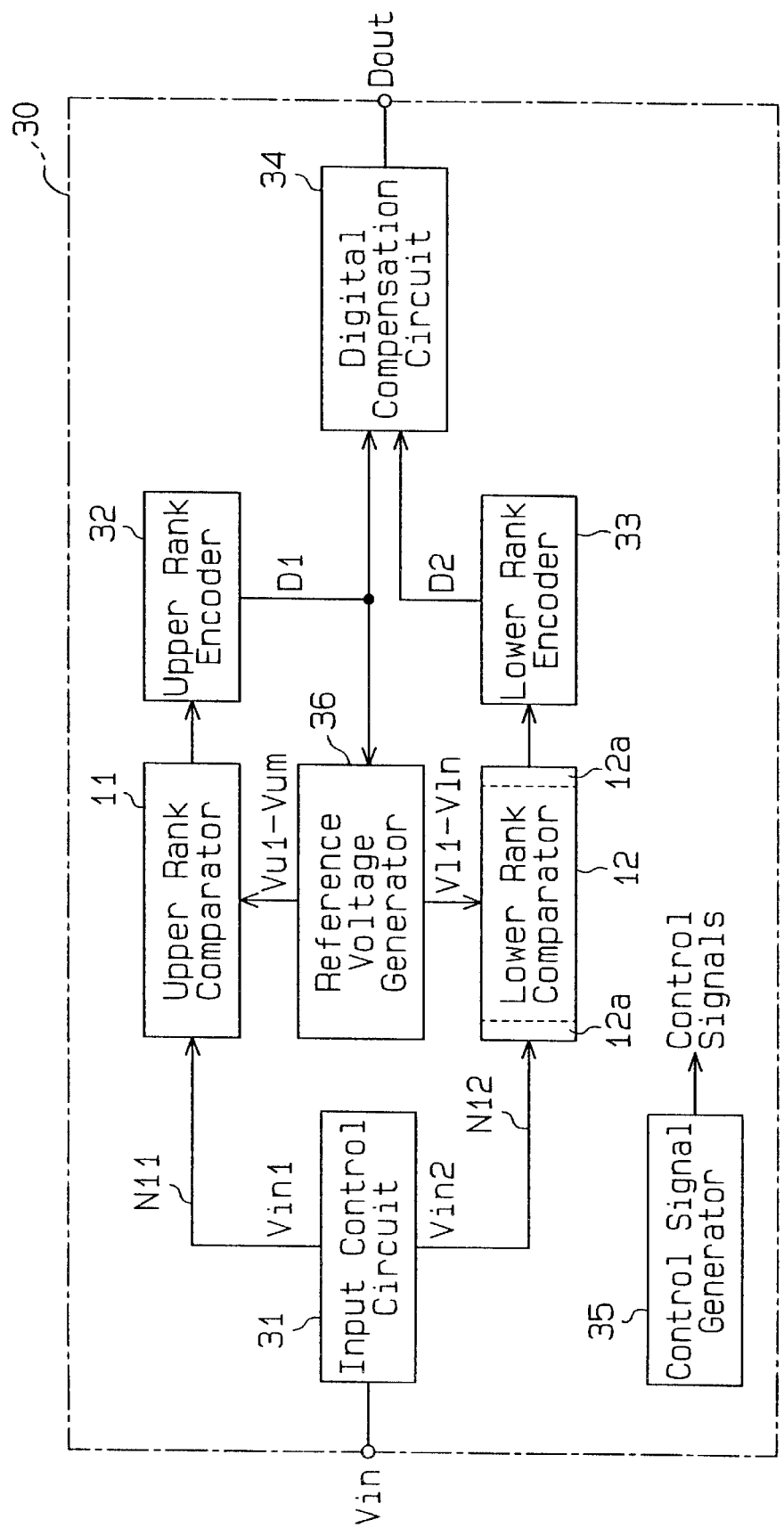
FIG. 8 is a schematic block diagram showing a series-parallel type A/D converter according to a second embodiment of the present invention.

FIG. 8 is a schematic block diagram showing an A/D converter 30 according to a second embodiment of the present invention. The A/D converter 30 is a series-parallel type A/D converter and converts an analog input signal $V_{in}$ to a digital output signal $D_{out}$ having a predetermined number of bits.

The A/D converter 30 includes an upper rank comparator 11, a lower rank comparator 12, an input control circuit 31, upper and lower rank encoders 32, 33, a digital compensation circuit 34, a control signal generator (operation control circuit) 35, and a reference voltage generator 36. The control signal generator 35 generates signals for controlling the circuits 11, 12, 31–34, 36.

The input control circuit 31 receives the analog input signal $V_{in}$ and sends internal analog input signals $V_{in1}$, $V_{in2}$ to the upper and lower rank comparators 11, 12 through separate wires N11, N12 in response to control signals SO, SC, respectively, which are sent from the control signal generator 35. The internal analog input signals $V_{in1}$, $V_{in2}$ are provided when the upper and lower rank comparators 11, 12 perform sampling. The input control circuit 31 further operates in response to the control signals SO, SC to reduce interference between the upper and lower rank comparators 11, 12 caused by switching noise.

The reference voltage generator 36 generates upper rank reference voltages $V_{U1}$–$V_{Um}$, each corresponding to an upper rank bit of the digital output signal $D_{out}$, and sends the reference voltages $V_{U1}$–$V_{Um}$ to the upper rank comparator 11. The reference voltage generator 36 further generates lower rank reference voltages $V_{L1}$–$V_{Ln}$, each corresponding to a lower rank bit of the digital output signal $D_{out}$, in accordance with an output signal D1 of the upper rank encoder 32 and sends the reference voltages $V_{L1}$–$V_{Ln}$ to the lower rank comparator 12.

The upper rank comparator 11 includes voltage comparators, the number (m) of which corresponds to the number of upper rank bits of the digital output signal $D_{out}$. Each voltage comparator of the upper rank comparator 11 compares the internal analog signal $V_{in1}$ with the corresponding upper rank reference voltage $V_{U1}$–$V_{Um}$. The lower rank comparator 12 includes voltage comparators, the number (n) of which corresponds to the number of lower rank bits and redundant bits of the digital output signal $D_{out}$. Each voltage comparator of the lower rank comparator 12 compares the internal analog signal $V_{in2}$ with the corresponding lower rank reference voltage $V_{L1}$–$V_{Ln}$. More specifically, the lower rank comparator 12 includes redundant voltage comparators 12a, which widen the A/D conversion input range of the lower bits and reduces errors that occur between the upper and lower rank bits.

The upper rank encoder 32 receives the comparison results of the upper rank comparator 11 and generates a binary code signal D1. The binary code signal D1 is sent to the reference voltage generator 36 and the digital compensation circuit 34. The lower rank encoder 33 receives the comparison results of the lower rank comparator 12 and generates a binary code signal D2. The binary code signal D2 is sent to the digital compensation circuit 34.

The digital compensation circuit 34 receives the binary code signals D1, D2 from the respective upper and lower rank encoders 32, 33 and generates the digital output signal $D_{out}$, while compensating for the errors in the upper and lower rank bits.

Figure 9:
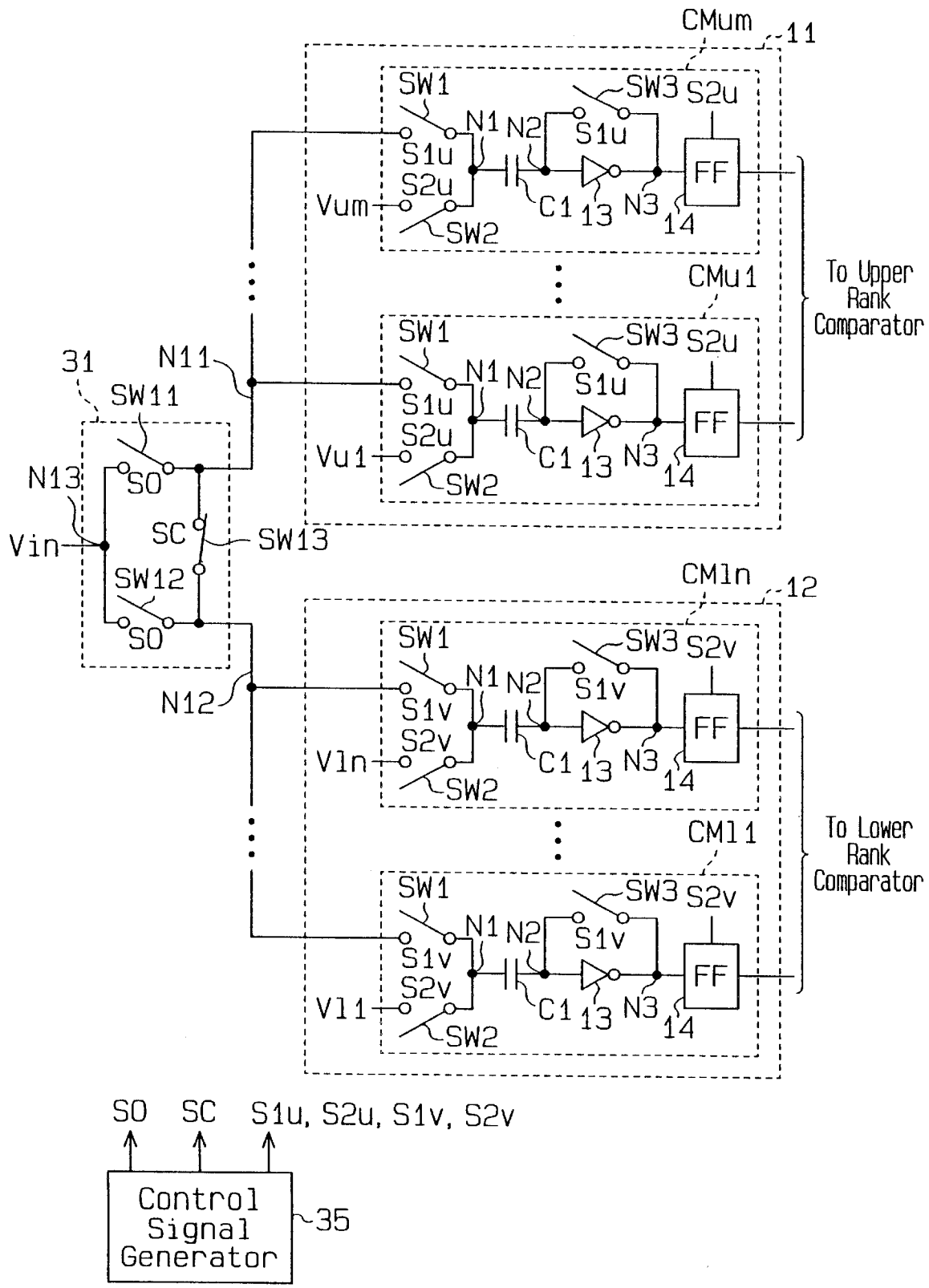
FIG. 9 is a circuit diagram showing an input control circuit, an upper rank comparator, and a lower rank comparator of the A/D converter of FIG. 8.

FIG. 9 is a schematic circuit diagram showing the input control circuit 31 and the upper and lower rank comparators 11, 12.

The input control circuit 31 includes three switches SW11, SW12, SW13. The first switch SW11 functions as a first input control circuit, and the second switch SW12 functions as a second input control circuit. The first and second switches SW11, SW12 have a common first terminal and separate second terminals, which are connected to the upper and lower rank comparators 11, 12 via wires N11, N12, respectively. Furthermore, the first and second switches SW11, SW12 are opened and closed in accordance with the control signal SO sent from the control signal generator 35. The third switch SW13 functions as an interchannel control circuit and is connected between the wires N11, N12. Furthermore, the third switch SW13 opens and closes in accordance with the control signal SC sent from the control signal generator 35.

The control signal generator 35 generates the control signal SO so that it falls earlier than the control signals S1u, S1v of the switches SW1 of the voltage comparators $CM_{U1}$–$CM_{Um}$, $CM_{L1}$–$CM_{Ln}$. This opens the first and second switches SW11, SW12 when the switches SW1 of the voltage comparators $CM_{U1}$–$CM_{Um}$, $CM_{L1}$–$CM_{Ln}$ are ON (i.e., when the upper and lower rank comparators 11, 12 perform sampling).

The switches SW11, SW12 are closed when the control signal SO is high and has a high potential power supply $V_{DD}$ level (H-level) and are opened when the control signal SO is low and has a low potential power supply (e.g., ground GND) level (L-level). When the switches SW11, SW12 are opened, the node N13, through which the analog input signal $V_{in}$ is supplied, is electrically separated from the wires N11, N12 causing the wires N11, N12 to enter a floating state.

The third switch SW13 is closed when the control signal SC is high and opened when the control signal SC is low. When the third switch SW13 opens, the wires N11, N12 are electrically separated from each other.

Figure 10:
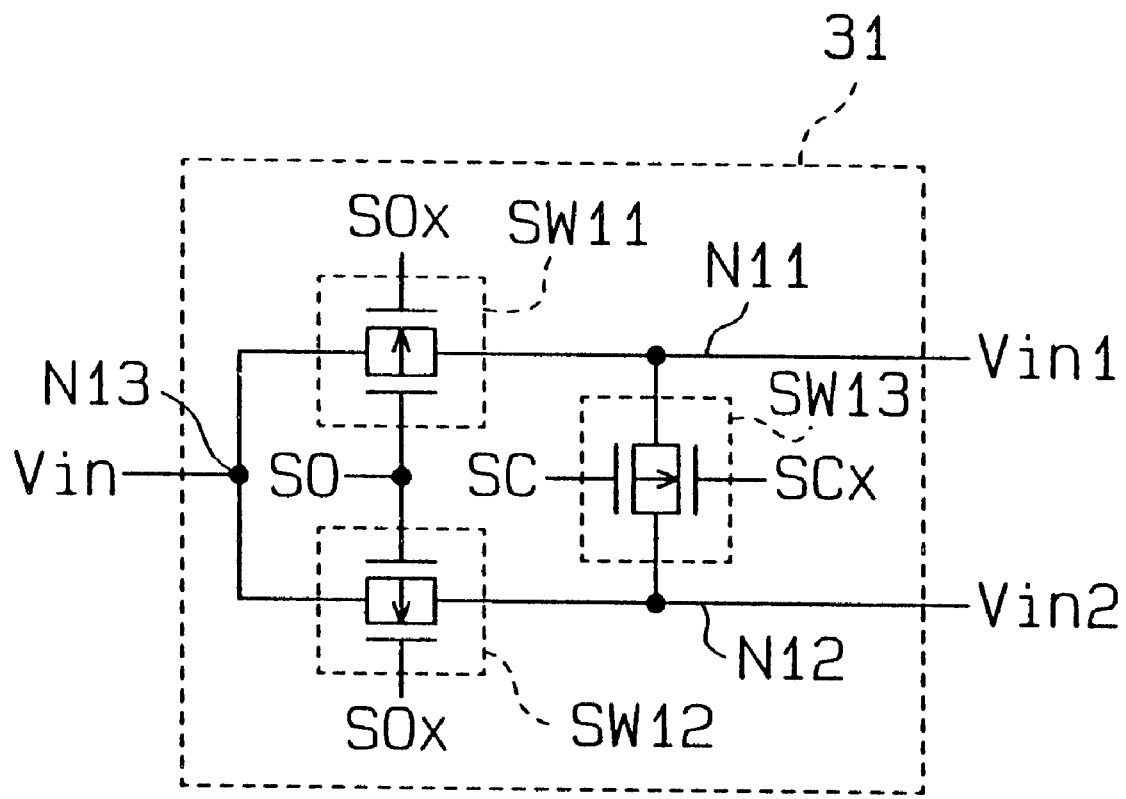
FIG. 10 is a circuit diagram of the input control circuit of FIG. 9.
Figure 10:
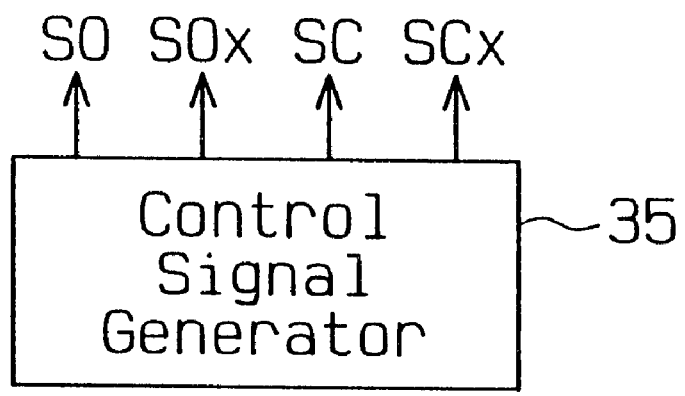

FIG. 10 is a circuit diagram showing the input control circuit 31. Each switch SW11–SW13 includes a P-channel MOS transistor and an N-channel MOS transistor. The control signal generator 35 generates an inverted control signal SOx of the control signal SO and an inverted control signal SCx of the control signal SC.

The control signal SO is sent to the NMOS transistor gate of each of the first and second switches SW11, SW12. The control signal SOx is sent to the PMOS transistor gate of each of the first and second switches SW11, SW12. The control signal SC is sent to the NMOS transistor gate of the third switch SW13 and the control signal SCx is sent to the PMOS transistor gate of the third switch SW13.

The inherent values of the switches SW11, SW12, such as the device dimensions of the MOS transistors, are determined in accordance with the number of voltage comparators $CM_{U1}$–$CM_{Um}$, $CM_{L1}$–$CM_{Ln}$ to balance the potential level of the wires N11, N12 and improve linearity of the digital signal. This is because the internal analog signals $V_{in1}$, $V_{in2}$ sent through the respective wires N11, N12 would transiently have different transitional levels and would thus affect the linearity of the digital output signal $D_{out}$ if the inherent values of the switches SW11, SW12 were substantially the same.

Figure 11:
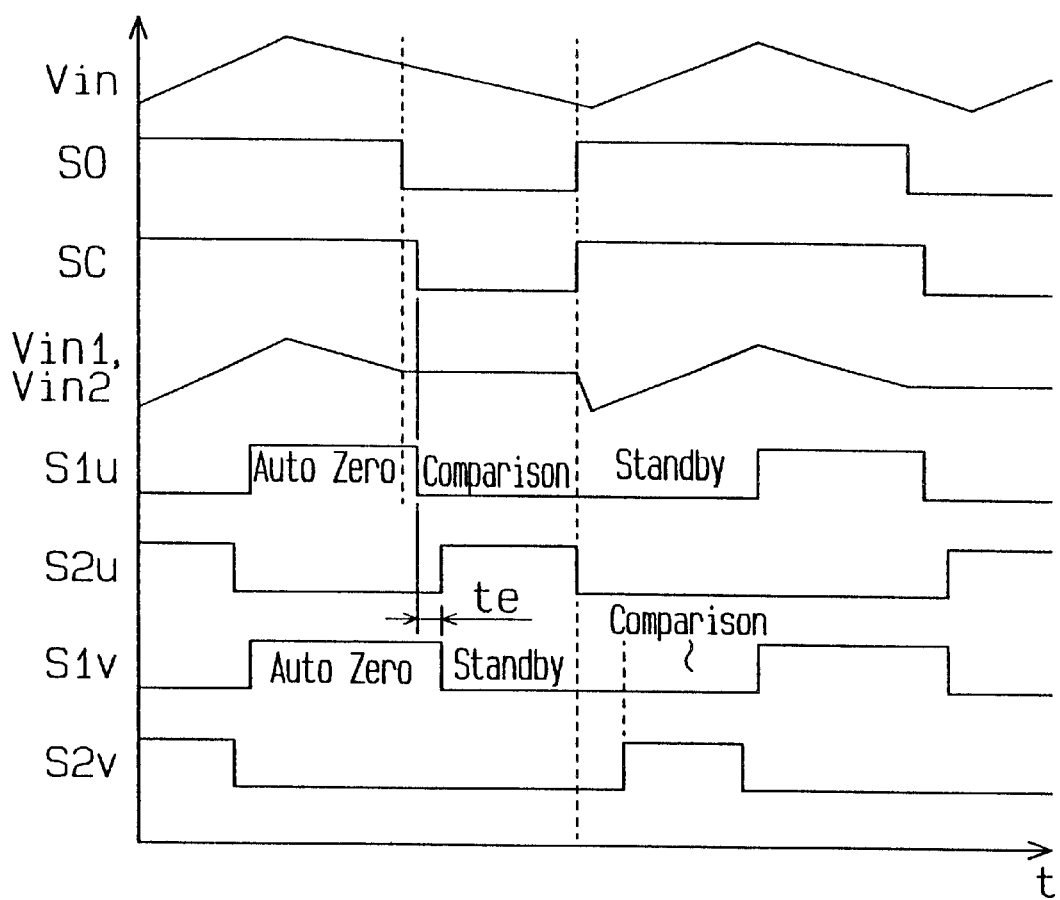
FIG. 11 is a timing chart showing the operation of the A/D converter of FIG. 8.

The operation of the A/D converter 30 will now be described with reference to FIG. 11.

When the control signals SO, SC output by the control signal generator 35 become high, all of the switches SW11–SW13 of the input control circuit 31 are closed. In this state, the potentials of the wires N11, N12 are substantially the same and fluctuate in correspondence with the analog input signal $V_{in}$.

If the control signals S1u, S1v become high and the control signals S2u, S2v become low, the voltage comparators $CM_{U1}$–$CM_{Um}$, $CM_{L1}$–$CM_{Ln}$ of the upper and lower rank comparators 11, 12 perform the auto zero operation and receive the analog input signal $V_{in}$ through the associated wires N11, N12.

When the control signal SO output by the control signal generator 35 becomes low, the switches SW11, SW12 are opened. This electrically separates the wires N11, N12 from the node N13, through which the analog input signal $V_{in}$ is input. Thus, the potential of the wires N11, N12 taken just before opening of the switches SW11, SW12 is maintained.

The control signal SC output by the control signal generator 35 then becomes low. The control signals S1u, S1v also become low to store the internal analog signals $V_{in1}$, $V_{in2}$. Due to differences in lengths of the wires N11, N12, the falling of the control signal S1v is delayed from that of the control signal S1u by a timing error te. Thus, when the control signal S1u opens the switches SW1 of the upper rank comparator 11, the switches SW1 of the lower rank comparator 12 remain closed. However, the control signal SC opens the third switch SW13 simultaneously with the opening of the switches SW1 of the upper rank comparator 11. Thus, switching noise produced by the switches SW1 is not transmitted through the wire N12 to the lower rank comparator 12. This prevents switching noise from being included in the potential of the wire N12. Accordingly, the voltage comparators $CM_{U1}$–$CM_{Um}$, $CM_{L1}$–$CM_{Ln}$ store internal analog signals $V_{in1}$, $V_{in2}$, which have substantially the same level.

The operation described above is performed not only when the fall of the control signal S1v is delayed from the control signal S1u but also when the fall of the control signal S1u is delayed from the control signal S1v.

The advantages of the second embodiment will now be described.

(1) The first and second switches SW11, SW12 of the input control circuit 31 are connected to each other by the first terminal, which is used to input the analog input signal $V_{in}$, and are connected to the respective lower and upper rank comparators 11, 12 by the second terminals through the associated wires N11, N12. The switches SW11, SW12 are opened in response to the control signal SO from the control signal generator 35 before the upper and lower rank comparators 11, 12 perform sampling. Accordingly, the analog input signal $V_{in}$ received through the wires N11, N12 by each of the upper and lower rank comparators 11, 12 (i.e., the internal analog signals $V_{in1}$, $V_{in2}$) have substantially the same level. Thus, the upper and lower rank comparators 11, 12 sample internal analog signals $V_{in1}$, $V_{in2}$, which have substantially the same level. This decreases the level error between the upper and lower rank comparators 11, 12.

(2) The third switch SW13 is connected between the wires N11, N12. The wires N11, N12 are electrically separated when the control signal SC from the control signal generator 35 opens the switch SW13. This reduces switching noise between the upper and lower rank comparators 11, 12.

It should be apparent to those skilled in the art that the present invention may be embodied in many other specific forms without departing from the spirit or scope of the invention. Particularly, it should be understood that the present invention may be embodied in the following forms.

(1) The opening and closing control of the switches SW11, SW12 using the control signals SO, SOx may be altered as described below.

The control signal generator 35 may keep the switches SW11, SW12 constantly closed by outputting a control signal SO having either a high potential power supply $V_{DD}$ level or a low potential power supply GND level. This results in the MOS transistors of the switches SW11, SW12 having a constant ON resistance value. Thus, switching noise produced in the upper rank comparator 11 (or the lower rank comparator 12) decreases as the noise passes through the switches SW11, SW12. Accordingly, interference between the wires N11, N12 caused by switching noise is reduced.

In another example, the control signal generator 35 may output a control signal SO having a predetermined voltage, which ranges between the H-level (high potential electric power supply $V_{DD}$ level) and the L-level (low potential electric power supply GND level), to control the MOS transistors of the switches SW11, SW12 in a constant state. This results in the MOS transistors having a constant resistance value. Accordingly, interference between the wires N11, N12 caused by switching noise is reduced.

In a further example, the control signal generator 35 may alter the level of the control signal SO to change the state of the switches SW11, SW12 in accordance with the operation timing of the A/D converter 30. In other words, the level of the control signal SO may be altered so that the resistance of the switches SW11, SW12 is set at a low value when performing sampling and a high value when in a switching state. In this case, the control signal generator 35 generates a control signal SO having a potential that ranges between the high potential power supply $V_{DD}$ and the low potential power supply GND in at least one of these states. This results in the switches SW11, SW12 functioning as low resistance elements during sampling and keeping the potential level of the wires N11, N12 substantially the same. During switching, the switches SW11, SW12 function as high resistance elements and reduce interference between the wires N11, N12, which is caused by switching noise.

If the switches SW11, SW12 function as high resistance elements, the upper rank comparator 11 and the lower rank comparator 12 may store different internal analog signals $V_{in1}$. However, the redundancy of the lower rank comparator 12 enables normal A/D conversion even if a sampling error occurs between the upper and lower rank comparators 11, 12. In other words, the switches SW11, SW12 may function as high resistance elemnts that do not open completely as long as the level error between the upper and lower rank comparators 11, 12 is included in a range that can be compensated by the compensation circuit 34.

(2) The switch SW13 of the input control circuit 31 may be eliminated if not required.

(3) The ON/OFF control of the switch SW13 may be altered in the following manner. The control signal generator 35 may provide the switch SW13 with a control signal SC having a high potential power supply $V_{DD}$ level or a lower potential power supply GND level so that the switch SW13 is constantly closed. This results in the MOS transistor of the switch SW13 having a constant ON resistance value and reduces switching noise, which is transmitted from the wire N11 to the wire N12 (or from the wire N12 to the wire N11).

In another example, the control signal generator 35 may send a control signal SC having a predetermined voltage, which ranges between the H-level (high potential power supply $V_{DD}$ level) and the L-level (low potential power supply GND level), to the switch SW13 so that the switch SW13 is controlled in a constant state. This results in the MOS transistor having a constant resistance value. Accordingly, interference between the wires N11, N12 caused by switching noise is reduced.

In a further example, the control signal generator 35 may alter the level of the control signal SC to change the state of the switch SW13 in accordance with the operation timing of the A/D converter 30. In other words, the level of the control signal SC may be altered so that the resistance of the switch SW13 is set at a low value when performing sampling and a high value when in a switching state. In this case, the control signal generator 35 generates a control signal SC having a potential that ranges between the high potential power supply $V_{DD}$ and the low potential power supply GND in at least one of these states. This results in the switch SW13 functioning as a low resistance element during sampling and keeps the potential level of the wires N11, N12 substantially the same. During switching, the switch SW13 functions as a high resistance element and reduces interference between the wires N11, N12, caused by switching noise.

(4) Appropriate elements may be connected in parallel to each switch SW11, SW12.

Figure 12A:
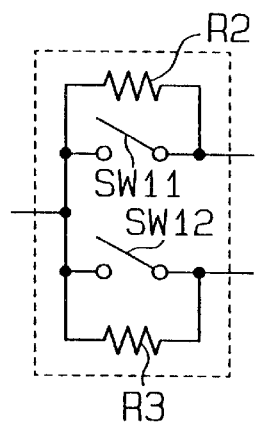
FIGS. 12(a) to 12(c) are circuit diagrams showing further examples of the input control circuit of FIG. 9.

As shown in FIG. 12(a), resistors R2, R3 may be connected in parallel with the switches SW11, SW12, respectively.

Figure 12B:
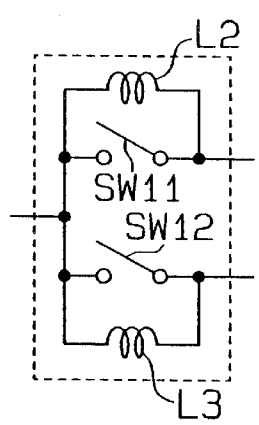

As shown in FIG. 12(b), an inductor L2, L3 may be connected in parallel with the switches SW11, SW12, respectively.

Figure 12C:
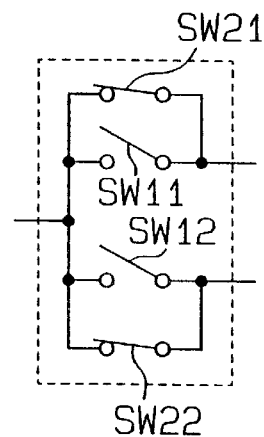

As shown in FIG. 12(c), switches SW21, SW22 may be connected in parallel with the switches SW11, SW12, respectively. In this case, it is preferred that the control signal generator 35 open and close the switches SW21, SW22 at opposite phases than that of the switches SW11, SW12. In other words, the control signal generator 35 sends the control signal SOx (FIG. 10) to the switches SW21, SW22.

The elements connected in parallel to the switches SW11, SW12 reduce the effects of the feedthrough charge produced when the switches SW11, SW12 are opened. This, in turn, reduces the effects of noise produced by the switching operation of the switches SW11, SW12.

(5) Each of the switches SW11–SW13 may be provided with only the PMOS transistor or only the NMOS transistor.

(6) A depletion type transistor may be employed as at least one of the transistors of the switch SW13. A depletion type transistor shifts to ON when the gate voltage is zero volts. Accordingly, if the switch SW13 is maintained in a constantly closed state, the switch SW13 need not be controlled. This reduces power consumption.

(7) The switch SW13 may be replaced by an appropriate element.

Figure 13A:
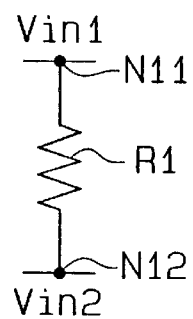
FIGS. 13(a) to 13(c) are circuit diagrams showing further examples of the input control circuit of FIG. 9.
Figure 13B:
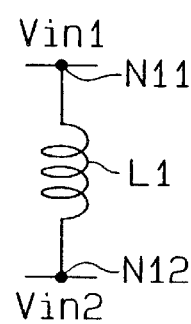

As shown in FIGS. 13(a) and 13(b), a resistor R1, an inductor L1, or a low current element may be connected between the wires N11, N12. These elements function as resistors countering alternating current, such as switching noise. Accordingly, the effects of switching noise, which is produced by the switching operation of the switches SW1 of one of the comparators 11, 12, on the other comparator 11, 12 are reduced.

Figure 13C:
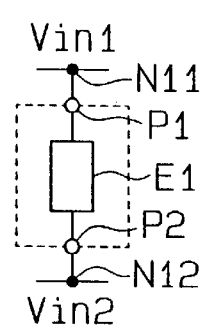

As shown in FIG. 13(c), an element E1 may be connected externally to the semiconductor chip forming the A/D converter 30. In this case, the A/D converter 30 has terminals P1, P2 (substrate terminals, or pads on the semiconductor chip), to which the element E1 is connected. The element E1 functions as a high-resistance element for countering the alternating current between the wires N11, N12. In this case, the resistance value of the element E1 can easily be changed. Furthermore, the terminals P1, P2 may be connected to each other by a wire, which functions as a resistor or an inductor.

(8) The present invention may be applied to an A/D converter having three comparators (i.e., upper rank, middle rank, and lower rank comparators) or one that has four or more comparators. In this case, an input control circuit is connected to each comparator. The present invention may also be applied to a pipe-line type A/D converter.

(9) The application of the present invention is not limited to a series-parallel type A/D converter 30. The present invention may be applied to a semiconductor apparatus having a plurality of analog input signals for receiving analog input signals of substantially the same level.

(10) The present invention may be embodied in an A/D converter having a lower rank comparator that is not provided with redundancy. In this case, the digital compensation circuit 34 of FIG. 8 becomes unnecessary.

(11) The control signal generator 35 may generate control signals SO, SC, which have opposite phases. More specifically, the first and second switches SW11, SW12 may be closed, while the third switch SW13 is opened during sampling. If the first and second switches SW11, SW12 are opened, the third switch SW13 is closed. Such control results in the third switch SW13 absorbing some of the feedthrough charge when the first and second switches SW11, SW12 are opened. Accordingly, the noise transmitted by the internal analog signals $V_{in1}$, $V_{in2}$ is reduced.

(12) The present invention may be applied to an A/D converter having a differential type voltage comparator. In this case, the switches SW11, SW12 of the input control circuit 31 function as an S/H circuit of the upper and lower rank comparators 11, 12. If the switches SW11, SW12 are used to function as an S/H circuit, transitional internal analog signals $V_{in1}$, $V_{in2}$ having different levels are sent to the wires N11, N12 depending on the number of upper rank and lower rank comparators 11, 12. This affects the linearity of the digital output signal $D_{out}$. Thus, it is preferred that the potential level of the wires N11, N12 be balanced by changing the inherent values of the switches SW11, SW12, such as the device dimension of the MOS transistors, in accordance with the number of comparators to reduce the influence on the linearity.

(13) Each switch SW11, SW12 may be connected to a separate control signal generator. In this case, it is preferred that the timing error of the control signal for opening and closing the switches SW11, SW12 is set within a range that can be compensated for by the compensation circuit 34.

The present examples and embodiments are to be considered as illustrative and not restrictive, and the invention is not to be limited to the details given herein, but may be modified within the scope and equivalence of the appended claims.

What is claimed is:

1. A semiconductor integrated circuit comprising:
   a plurality of analog processing circuits for processing analog signals; and
   a plurality of input control circuits connected to the plurality of analog processing circuits, respectively, wherein the input control circuits receive an analog signal through a common node and selectively send the analog signal to the analog processing circuits.

2. The semiconductor integrated circuit according to claim 1, wherein at least one of the analog processing circuits samples the analog signal and holds the sampled analog signal for a predetermined time length.

3. The semiconductor integrated circuit according to claim 1 further comprising an operation control circuit connected to the input control circuits, wherein the operation control circuit controls the operation of each of the input control circuits.

4. The semiconductor integrated circuit according to claim 3, wherein each of the input control circuits performs conductive and non-conductive operations, and wherein the operation control circuit controls the operation of each input control circuit so that the input control circuits perform either the conductive operation or the non-conductive operation in relation with the operation of the analog processing circuits.

5. The semiconductor integrated circuit according to claim 4, wherein the analog processing circuits sample the analog signal and hold the sampled analog signal for a predetermined time length, and wherein the operation control circuit controls the input control circuits so that they are non-conductive when the analog processing circuits are in a sampling state.

6. The semiconductor integrated circuit according to claim 1, wherein each input control circuit includes a MOS transistor having a gate for receiving a control signal with a voltage ranging between a high potential and a low potential.

7. The semiconductor integrated circuit according to claim 1, wherein each of the input control circuits includes a switching element having an inherent value which is set in correspondence with the associated analog processing circuit.

8. The semiconductor integrated circuit according to claim 1, wherein each of the input control circuits includes a switching element and a resistor connected in parallel with the switching element.

9. The semiconductor integrated circuit according to claim 1, wherein each of the input control circuits includes a switching element and an inductor connected in parallel with the switching element.

10. The semiconductor integrated circuit according to claim 1, wherein each of the input control circuits includes a first switching element and a second switching element connected in parallel with the first switching element.

11. The semiconductor integrated circuit according to claim 10 further comprising an operation control circuit connected to the input control circuits, wherein the operation control circuit controls the first and second switching elements of each input control circuit in opposite phases.

12. The semiconductor integrated circuit according to claim 1, wherein the analog processing circuits include first and second analog processing circuits, wherein the input control circuits includes first and second switches each having a first terminal connected to the common node and a second terminal connected to the respective first and second analog processing circuits, and wherein the semiconductor integrated circuit further comprises an interchannel control circuit connected between the second terminals.

13. The semiconductor integrated circuit according to claim 12, wherein the interchannel control circuit includes a MOS transistor having a gate for receiving a control signal with a voltage ranging between a high potential and a low potential.

14. The semiconductor integrated circuit according to claim 12, wherein the interchannel control circuit includes a MOS transistor having a gate for receiving a control signal with a predetermined voltage which is between a high potential and a low potential.

15. The semiconductor integrated circuit according to claim 12, wherein the interchannel control circuit includes a MOS transistor having a gate for receiving a control signal with a predetermined voltage, which is set between a high potential and a low potential in accordance with the operation timing of the analog processing circuits.

16. The semiconductor integrated circuit according to claim 12, wherein the interchannel control circuit includes at least one depletion type transistor.

17. The semiconductor integrated circuit according to claim 12 further comprising an operation control circuit connected to the input control circuits and the interchannel control circuit, wherein the operation control circuit controls the operations of each input control circuit and the interchannel control circuit.

18. The semiconductor integrated circuit according to claim 12, wherein the interchannel control circuit includes a resistor.

19. The semiconductor integrated circuit according to claim 12, wherein the interchannel control circuit includes an inductor.

20. The semiconductor integrated circuit according to claim 12, wherein the semiconductor integrated circuit is formed on a single silicon substrate, and wherein the interchannel control circuit is connected externally to the substrate between the second terminals of the first and second switches.

21. The semiconductor integrated circuit according to claim 12, wherein the semiconductor integrated circuit includes a first substrate terminal connected to the first terminal and a second substrate terminal connected to the second terminal, the first and second substrate terminals being formed on a single substrate, and wherein the inter-channel control circuit is connected externally to the substrate between the first and second substrate terminals.

22. A semiconductor integrated circuit comprising:

a plurality of analog processing circuits for processing analog signals, wherein each of the analog processing circuits includes at least one voltage comparator for comparing an analog signal with a reference voltage and generating a signal indicating the comparison result;

a plurality of input control circuits connected to the analog processing circuits, respectively, wherein the input control circuits receive the analog signal through a common node and selectively send the analog signal through a common node and selectively send the analog signals to the voltage comparators;

a reference voltage generator for receiving a comparison result signal and generating the reference voltage based on the comparison result signal; and a plurality of encoders for receiving the comparison results from the voltage comparators of the analog processing circuits and generating code signals.

23. The semiconductor integrated circuit according to claim 22, wherein one of the analog processing circuits includes a redundant comparator for widening the input range of at least one of the voltage comparators, and wherein the semiconductor integrated circuit further comprises a compensation circuit for receiving the code signals from the encoders and compensating the code signals to generate digital signals.

24. The semiconductor integrated circuit according to claim 22, wherein the voltage comparators sample the analog signal and hold the sampled analog signal for a predetermined time length.

25. The semiconductor intergrated circuit according to claim 22 further comprising an operation control circuit connected to them inout control circuits, wherein the operation control circuit controls the operation of each of the input control circuits.

26. The semiconductor intergrated circuit according to claim 25, wherein each of the input control circuits performs conductive and non-conductive operations, and wherein the operation control circuit controls the operation of each input control circuit so that the input control circuits perform either the conductive operation or the non-conductive operation in relation with the operation of the voltage comparators.

27. The semiconductor intergrated circuit according to claim 26, wherein the voltage comparators sample the analog signal and hold the sampled analog signal for a predetermined time length, and wherein the operation control circuit controls the input control circuits so that they are non-conductive when the voltage comparators are in a sampling state.

28. The semiconductor intergrated circuit according to claim 22, wherein the analog processing circuits include first and second analog processing circuits, wherein the input control circuits includes first and second switches each having a first terminal connected to the common node and a second terminal connected to the respective first and second analog processing circuits, and wherein the semiconductor integrated circuit further comprises an interchannel control circuit connected between the second terminals.

* * * * *